United States Patent [19]
Matsumoto et al.

[11] Patent Number: 5,119,070
[45] Date of Patent: Jun. 2, 1992

[54] RESONANT TAG

[75] Inventors: Takeshi Matsumoto; Yuji Suzuki, both of Yokohama, Japan

[73] Assignee: Tokai Metals Co., Ltd., Kanagawa, Japan

[21] Appl. No.: 774,158

[22] Filed: Oct. 15, 1991

Related U.S. Application Data

[63] Continuation of Ser. No. 469,168, Jan. 24, 1990, abandoned.

[30] Foreign Application Priority Data

Jan. 25, 1989 [JP] Japan ................................. 1-14149

[51] Int. Cl.$^5$ .............................................. G08B 13/22
[52] U.S. Cl. ................................................ 340/572
[58] Field of Search .................. 340/572; 361/397, 410

[56]  References Cited
U.S. PATENT DOCUMENTS

| | | | |
|---|---|---|---|
| 3,720,940 | 3/1973 | Fox et al. ............................ | 340/572 |
| 3,967,161 | 6/1976 | Lichtblau ............................ | 340/572 |
| 4,021,705 | 5/1977 | Lichtblau ............................ | 340/572 |
| 4,717,438 | 1/1988 | Benge et al. ........................ | 340/572 |
| 4,727,360 | 2/1988 | Ferguson et al. ................... | 340/572 |
| 4,752,680 | 6/1988 | Larsson ............................... | 235/451 |

FOREIGN PATENT DOCUMENTS

| | | |
|---|---|---|
| 0149240 | 7/1985 | European Pat. Off. . |
| 0059723 | 3/1986 | European Pat. Off. . |
| 0186185 | 7/1986 | European Pat. Off. . |
| 3732825 | 3/1988 | Fed. Rep. of Germany . |

WO86/04172  7/1986  PCT Int'l Appl. .

Primary Examiner—Glen R. Swann, III
Attorney, Agent, or Firm—Finnegan, Henderson, Farabow, Garrett & Dunner

[57] ABSTRACT

A resonant tag carries a plurality of resonant circuits having different resonant frequencies. The resonant circuit is composed of a first conductive pattern formed by a conductive metal foil on one surface of an insulating thin film and a second conductive pattern formed by a conductive metal foil on the other surface of the insulating thin film. The first conductive pattern contains an inductor element and an element of the capacitor, which correspond to a resonant frequency of the resonant circuit. The second conductive pattern contains the other element of the capacitor element. The capacitor element of the second conductive pattern, which corresponds to the resonant frequency, is disposed at a position where it faces the capacitor element of the first conductive pattern formed on one surface of the insulating thin film. When the resonant tag is used, the conductive metal foils formed on the two surfaces of the insulating synthetic resin film are electrically connected so as to turn off part of the resonant circuits, so that the resonant tag can be identified by a combination of resonant frequencies inherent in the remaining resonant circuits. For example, n (two or more) resonant circuits having different resonant frequencies may be formed on a resonant tag so that the tag can be identified in $2^n-1$ (or $2^n$) different ways.

2 Claims, 8 Drawing Sheets

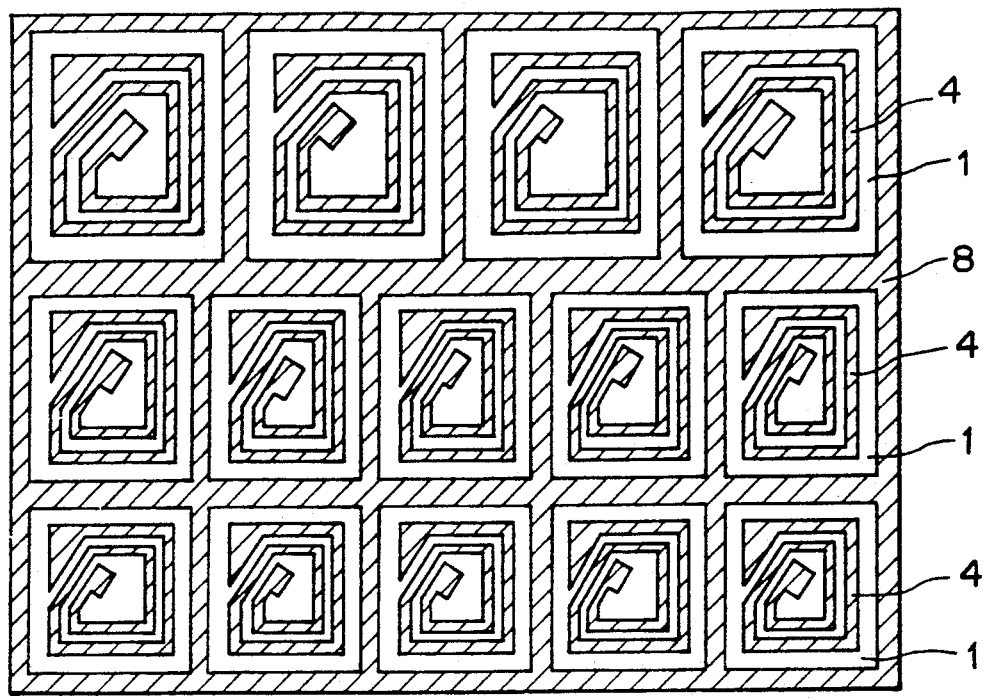
F I G. 1
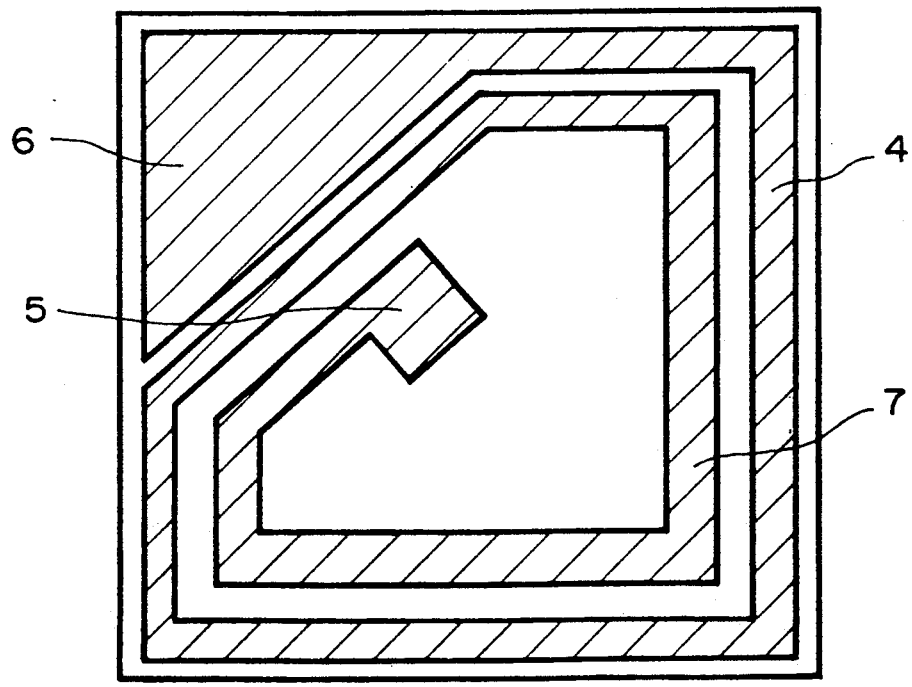
F I G. 2

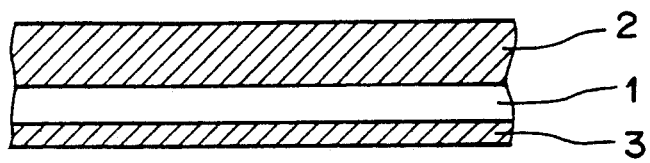
F I G. 6
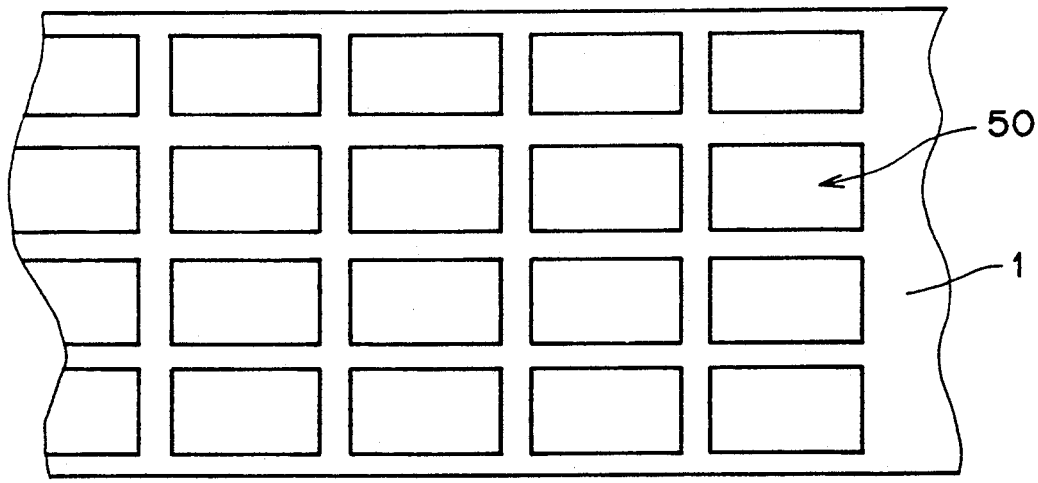
F I G. 7

| | | | |
|---|---|---|---|
| f1 | f2 | f3 | f4 |

| | | | | |
|---|---|---|---|---|
| f5 | f6 | f7 | f8 | f9 |
| f10 | f11 | f12 | f13 | f14 |

| | f1 | f2 | f3 | f4 | f5 | f6 | f7 | f8 | f9 | f10 | f11 | f12 | f13 | f14 |
|---|---|---|---|---|---|---|---|---|---|---|---|---|---|---|
| NUMBER OF TURNS | 11 | 9 | 6 | 7 | 9 | 6 | 7 | 5 | 4 | 3 | 4 | 3 | 2 | 2 |
| WIDTH OF CONDUCTOR (mm) | 0.5 | 0.5 | 0.5 | 0.7 | 0.5 | 0.5 | 0.7 | 0.7 | 0.7 | 0.7 | 1.0 | 1.0 | 1.0 | 1.3 |
| DISTANCE BETWEEN CONDUCTORS (mm) | 0.3 | 0.3 | 0.3 | 0.3 | 0.3 | 0.3 | 0.3 | 0.3 | 0.3 | 0.3 | 0.4 | 0.4 | 0.4 | 0.4 |

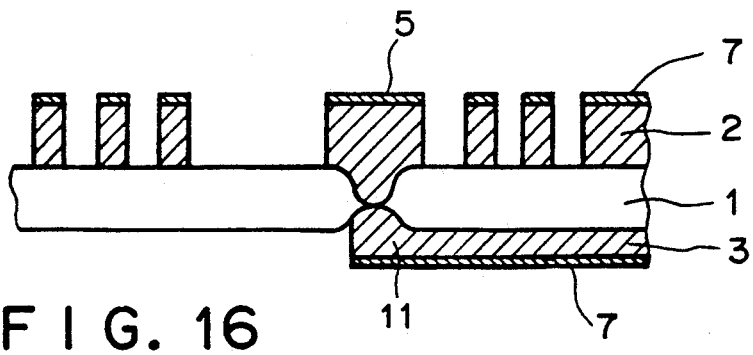
F I G. 16
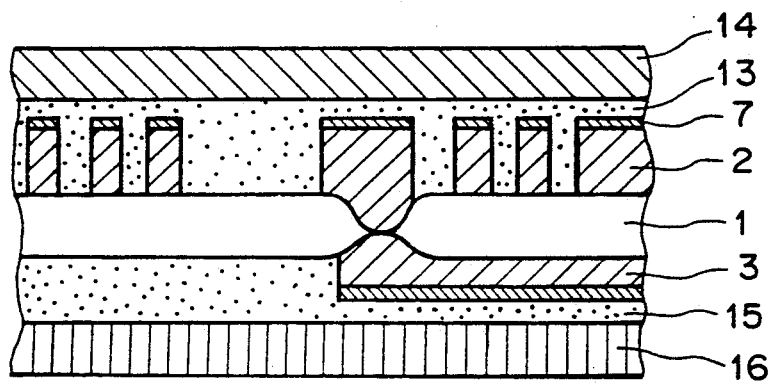
F I G. 17
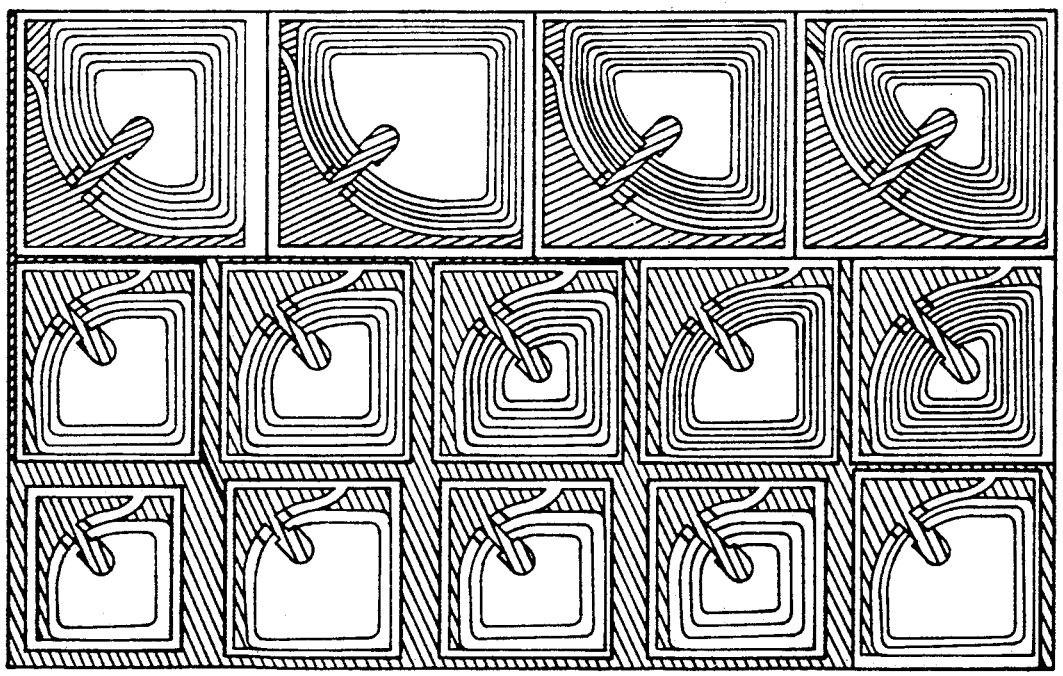
F I G. 18

RESONANT TAG

This application is a continuation of application Ser. No. 07/469,168 filed Jan. 24, 1990, now abandoned.

BACKGROUND OF THE INVENTION

1. Field of the Invention

The present invention relates to a resonant tag on which at least two resonant circuits having different resonant frequencies are formed and which can be identified by the detection of the resonant frequencies of the resonant circuits. The present invention also pertains to a method of manufacturing such a resonant tag.

2. Description of the Related Art

Conventionally, transportation of goods is conducted by utilizing railways, trucks, ships, airplanes and so on. In recent years, however, transportation of light-weight parcels by small trucks or the like, called Takuhaibin, have become very popular because of its low cost. In this type of transportation, a forwarding agent collects and delivers parcels to destinations in a short period of time. This transportation is known by its simple procedure and fast delivery of parcels.

In such transportation, parcels are attached with a label on which a sender, a destination and so on are filled in. A delivery man looks at the labels on the parcels and thereby checks the destinations and conducts sorting out of the parcels. Recently, checking of destinations and sorting out of the parcels have also been conducted in the following manners: in one method, destinations are coded, and sorting out of the parcels are conducted using the coded destinations. In another method, a delivery man carries with him or her a bar code system, and parcels carry on them a label on which bar codes representing a sender, destination and so on are printed.

However, in this transportation method, parcels are often delivered to a wrong destination or lost before they reach the destinations. Such accidents cost a forwarding agent substantial sums of money for investigation and compensation.

These accidents may be decreased by reinforcing visual checking of parcels. However, reinforcement of visual checking of parcels increases cost and prolongs the time for delivery. In any way, it requires manpower and limits reliability.

Furthermore, in a case where parcels are attached with a label on which a bar code is printed, the label must be in a state in which it can be optically read.

In other words, in order to read the bar code, the parcel must be positioned such that the surface thereof on which the bar code is printed is turned upward. If the surface with the label is turned downward, the bar code cannot be read, causing delivery of the parcel to an incorrect destination.

Furthermore, there is a limitation to the degree at which a bar code is read: if a label is adhered to an irregular surface, the bar code may be read incorrectly. This limits the size of the parcel on which the label is pasted.

SUMMARY OF THE INVENTION

In view of the aforementioned problems of the related art, an object of the present invention is to provide a resonant tag which can be identified using a combination of resonant frequencies inherent in individual resonant circuits, as well as a method of manufacturing such a resonant tag.

In other words, an object of the present invention is to provide a thin-film resonant tag on which n (two or more) resonant circuits having different resonant frequencies are formed so as to enable the tag to be identified in $2^n - 1$ (or $2^n$) different ways.

These objects are achieved by the provision of a resonant tag on which at least two resonant circuits having different resonant frequencies are formed so as to enable the tag to be identified by the resonant frequencies of the resonant circuits. The resonant circuit is composed of a first conductive pattern formed on one surface of an insulating thin film and a second conductive pattern formed on the other surface of the insulating thin film. The first conductive pattern contains an inductor element and an element of the capacitor, which correspond to a resonant frequency. The second conductive pattern contains the other element of the capacitor. The capacitor element of the second conductive pattern, which corresponds to the resonant frequency, is disposed at a position where it faces the capacitor element of the first conductive pattern formed on one surface of the insulating thin film.

The thus-arranged resonant tag can be identified by a combination of resonant frequencies inherent in the individual resonant circuits.

n (two or more) resonant circuits having different resonant frequencies may be formed on a resonant tag so that the tag can be identified in $2^n - 1$ (or $2^n$) different ways.

Other features and advantages of the invention will be apparent from the following description taken in connection with the accompanying drawings.

BRIEF DESCRIPTION OF THE DRAWINGS

FIG. 1 is a plan view of an embodiment of the present invention;

FIG. 2 shows an example of an inductor pattern of the embodiment of FIG. 1;

FIG. 6 shows a flexible sheet on which conductive thin films are adhered;

FIG. 7 shows the positional arrangement of tag sheets, which is employed in the embodiment of FIG. 1;

FIG. 16 is a cross-sectional view of the flexible sheet on which electrical connection has been conducted;

FIG. 17 is a cross-sectional view of the flexible sheet on which electrical connection has been conducted;

FIG. 18 shows an example of the optimal arrangement and orientation of the resonant frequency circuit patterns.

DETAILED DESCRIPTION OF PREFERRED EMBODIMENT

An embodiment of the present invention will now be described with reference to the accompanying drawings.

In this embodiment of a resonant tag, a predetermined number of resonant circuits having different resonant frequencies inherent in the individual resonant circuits are formed on a flexible insulating thin film having arbitrary size and shape. Each of the resonant circuits contains at least one inductor (inductor element) and at least one capacity (capacitor circuit element). The resonant circuit is an LC circuit which can be resonant at a particular frequency.

FIG. 1 is a plan view of a resonant tag on which a large number of resonant circuits are formed.

In the resonant tag shown in FIG. 1, inductor circuits 4 of resonant circuits are formed on an electrically insulating synthetic resin film 1 which is an insulating substrate. The individual resonant circuits are separated from adjacent resonant circuits by a separating portion 8 so as to allow mutual interference to be reduced.

The inductor circuits 4, the separating portion 8 and other circuits of the resonant circuits, which will be described later, are formed of a conductive metal foil.

The insulating synthetic resin film 1 may be formed of a synthetic resin which has a relatively low dielectric dissipation factor, which corresponds to frequencies of designed circuits and which permits accurate tolerance in thickness, such as polyethylene, polypropylene, polystyrene or polyester.

The metal foil may be formed of various metals having a good conductivity, such as gold, silver, copper or aluminum, or various alloys of such metals.

From the viewpoint of production cost, polyethylene and aluminum foil are preferable because of their inexpensiveness. Also, aluminum foil is preferable because it can be adhered to the polyethylene resin easily. Also, aluminum foil ensures excellent flexibility.

Hence, the present embodiment employs a polyethylene film as the insulating synthetic resin film 1 and an aluminum foil as the conductive metal foil. In practice, an aluminum foil conforming to AA standard 1235 and containing Al (99.3%), Si (0.1%), Fe (0.3%), Cu (0.05%) and so on is employed.

The resonant tag of this embodiment contains 14 different resonant circuits having different resonant frequencies, as shown in FIG. 1.

Next, the resonant circuit will be described below in detail with reference to FIGS. 2 to 4.

Figure 3:
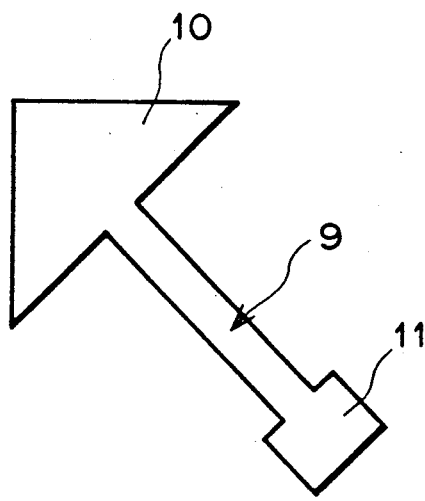
FIG. 3 shows an example of a capacitor pattern of the embodiment of FIG. 1.
Figure 4:
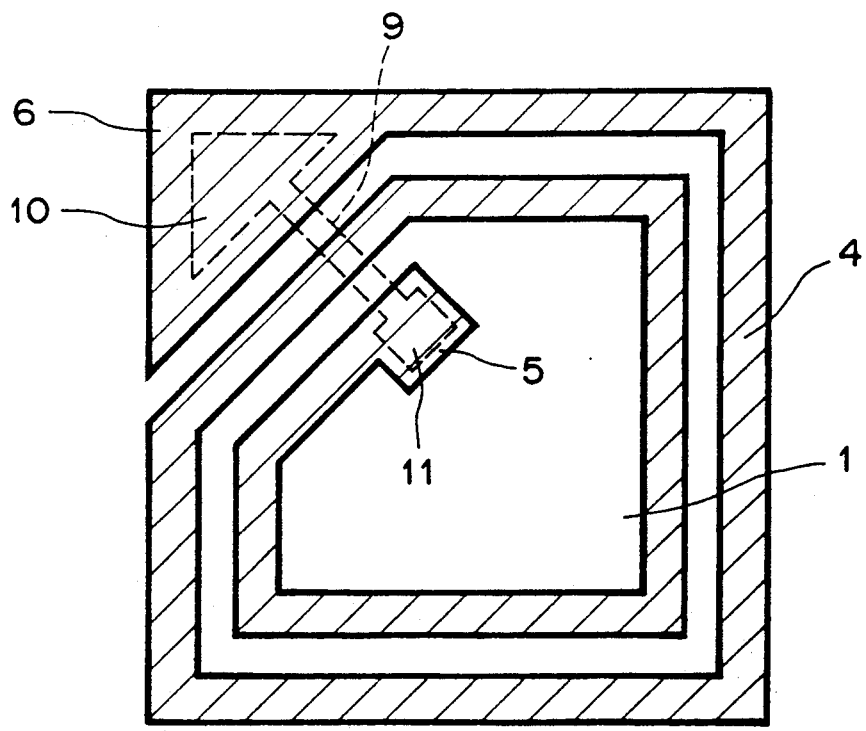
FIG. 4 shows the positional relation between conductive patterns of the embodiment of FIG. 1.

FIG. 2 shows an inductor circuit pattern 4, FIG. 3 shows a capacitor circuit pattern 9, and FIG. 4 shows positional relation between the two patterns separated by the insulating synthetic resin film 1.

As shown in FIG. 2, the inductor circuit pattern 4 has a terminal portion 5, a capacitor portion 6, and an inductor forming pattern portion 7.

As shown in FIG. 3, the capacitor circuit pattern 9 has a capacitor portion 10, and a terminal portion 11.

The inductor circuit pattern 4 shown in FIG. 2 is formed on one surface of the insulating synthetic resin film 1, and the capacitor circuit pattern 9 shown in FIG. 3 is formed on the other surface, as shown in FIG. 4. The two patterns 4 and 9 in combination form a resonant circuit. The terminal portion 11 of the capacitor circuit pattern 9 is formed on one surface of the insulating synthetic resin film 1 at a position where it faces the terminal portion 5 of the inductor circuit pattern 4 formed on the opposite surface of the insulating synthetic resin film 1, so that the terminal portions 5 and 11 of the two patterns 4 and 9 can be conducted to form a resonant circuit.

The two circuit element patterns may be printed by various printing methods, including silk screen printing, flexographic printing, letterpress printing and gravure printing.

Manufacture process of the thus-arranged resonant tag will be described below with reference to FIG. 5.

When a resonant tag is manufactured, a flexible sheet is prepared first in step S1. The flexible sheet is the insulating synthetic resin film 1 with conductive metal foils 2 and 3 attached on the two surfaces thereof.

The insulating synthetic resin film 1 has a thickness ranging from 5 microns ($\mu$) to 30 microns ($\mu$) with an allowance of $\pm 5$ %. The thickness of the insulating synthetic resin film 1 is determined by factors, including the range of the resonant frequencies of the resonant circuits formed thereon, the performance of the resonant tag, and the adhering method employed to adhere the conductive metal foils which form the conductive areas onto the synthetic resin film 1.

A thick foil 2 (having a thickness ranging between 50 microns to 100 microns) is used as the conductive metal foil which forms the inductor circuit patterns in order to reduce an electric resistance. A thin foil 3 (having a thickness ranging between 5 microns to 15 microns) is used as the conductive metal foil which forms the capacitor circuit patterns because it is used to form only the plates and the terminals of the capacitors. The use of the thin foil 3 reduces etching cost.

In this embodiment, an aluminum foil having a thickness of 50 microns ($\mu$) and a width of 800 mm is employed as the thick foil 2, and an aluminum foil having a thickness 12 microns ($\mu$) and a width of 760 mm is employed as the thin foil 3. Both aluminum foils conform to AA standard 1235. The thickness and the size of the aluminum foils may be any arbitrary values which are suited to the resonant circuits formed.

FIG. 6 shows a flexible sheet formed in the manner described above.

The flexible sheet shown in FIG. 6 is formed by covering the insulating synthetic resin film 1 with the conductive metal foils 2 and 3 in either of the following two manners:

(1) The conductive metal foils 2 and 3 are directly adhered to the film 1 which is extruded from a T die of an extruder.

(2) The insulating synthetic resin film 1 with the conductive metal foils 2 and 3 on the two surfaces are passed between rolls which are heated to a predetermined temperature so as to adhere the film 1 to the metal foils 2 and 3 by means of the heat and the pressure applied by the rolls.

With the machining conducted subsequent to the adhesion taken into consideration, the insulating synthetic resin film 1 should adhered to the conductive metal foils at an adhesive strength of 300 g/cm or above.

The adhesive strength may be increased by activating the surface of both types of material or of either material. Corona discharge treatment may be employed for surface activation.

Furthermore, an adhesive layer may be provided between the two types of material. In that case, an adhesive formed of the same resin as the insulating synthetic resin 1 may be used.

Although the shape or size of one tag sheet is determined by the number of resonant circuits formed on it or the resonant frequencies of the resonant circuits formed on it, it should be any value which ensures that integral multiples of tag sheets are aligned in a direction of the effective material width of machines used subsequent to the printing process. This is necessary to enable mass production at a low production cost.

In this embodiment, a tag sheet has dimensions of 80 mm × 130 mm, and the tag sheets are arranged such that the sides thereof having a dimension of 80 mm are aligned in the direction of the effective material width of the machines.

FIG. 7 shows an example of arrangement of tag sheets.

A reference numeral 50 denotes a resonant circuit portion.

Next, in step S2, a plurality of resonant circuit patterns having inherent frequencies are printed by the gravure printing method on the surfaces of the conductive metal foils 2 and 3 adhered on the two sides of the insulating synthetic resin film 1 using an printing ink 7 which withstands etching (a polyester type ink which withstands etching is employed in this embodiment). Each of the resonant circuit patterns is composed of the inductor circuit pattern 4 such as that shown in FIG. 2 and the capacitor circuit pattern 9 such as that shown in FIG. 3.

Figure 8:
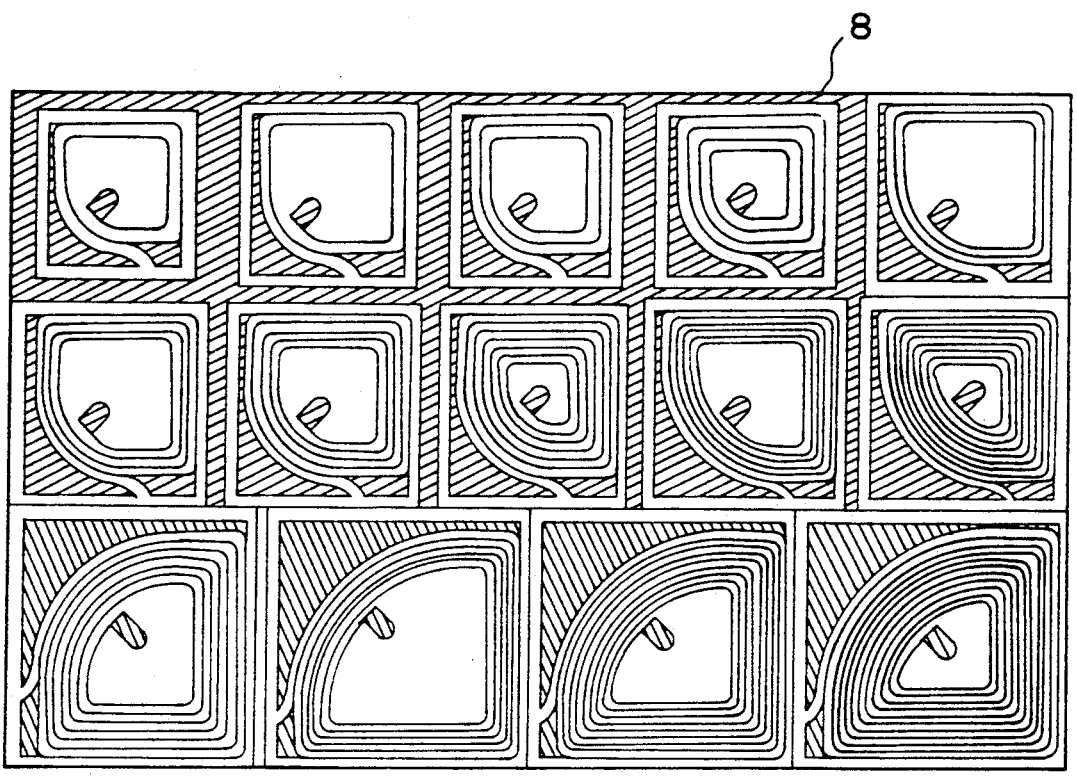
FIG. 8 shows an example of an inductor circuit pattern of the embodiment of FIG. 1.
Figure 9:
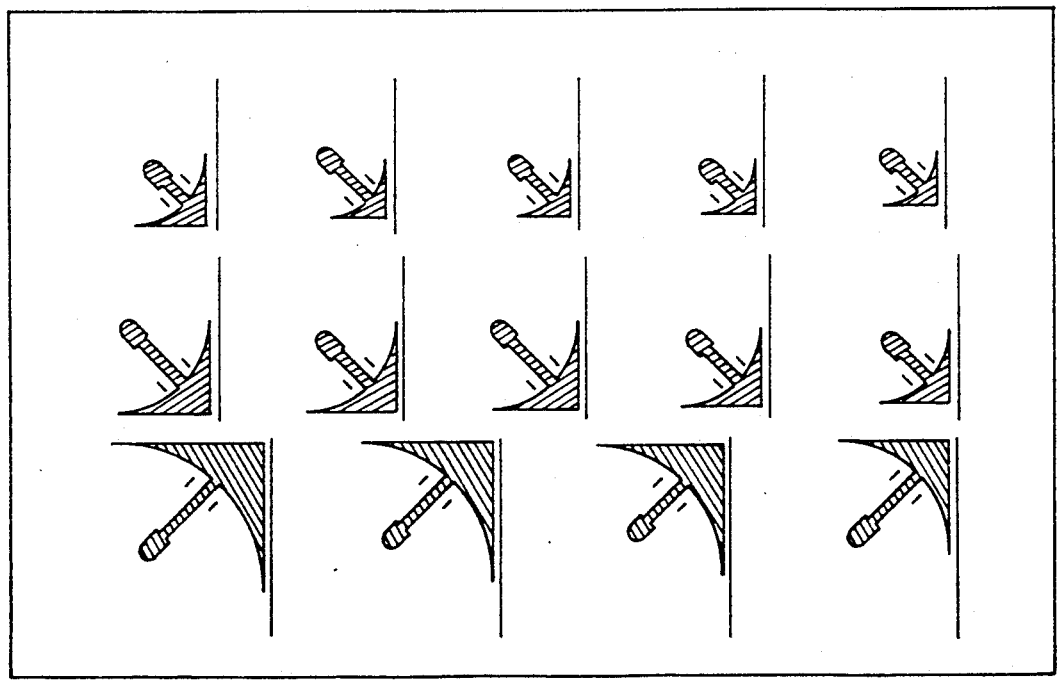
FIG. 9 shows an example of a capacitor circuit pattern of the embodiment of FIG. 1.

In this embodiment, in order to form 14 resonant circuit patterns having inherent resonant frequencies in one tag sheet, an inductor circuit pattern shown in FIG. 8 is printed on the surface of the conductive metal foil 2, and a capacitor circuit pattern shown in FIG. 9 is formed on the surface of the metal foil 3.

Since the capacitor circuit pattern shown in FIG. 9 is printed on the thin conductive metal foil 3, the capacitor circuits 9 may be cut due to the shearing stress applied to the material by the coils (conductors) in the inductor circuits during the processes subsequent to the printing process. Therefore, some measures must be taken to eliminate cutting, depending on the thickness of the conductive metal foils employed or the circuit design. In this embodiment, this problem is solved by printing reinforcing islands having a certain size on the two sides of the portion of the conductor in the capacitor circuit pattern 9 which crosses the coil in the inductor circuit pattern 4.

Figures 10, 11, 12:
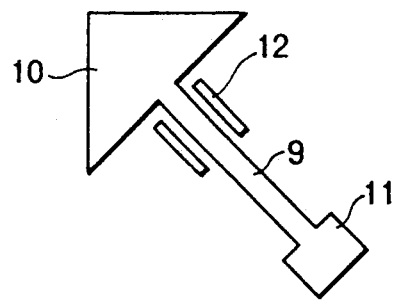
FIG. 10 shows a capacitor circuit pattern which contains island portions, showing a second embodiment of the present invention.
FIG. 11 shows an example of resonant circuit patterns which are adopted in the designing of the inductor circuit.
FIG. 12 shows examples of number of turns of the coil, of the conductor width and of the distance between the adjacent conductors in the inductor circuit of the embodiment of FIG. 1.

Such a capacitor circuit pattern is shown in FIG. 10, in which a reference numeral 12 denotes the island.

FIG. 11 shows an example of positional arrangement of 14 different resonant circuit patterns.

The resonant frequencies of the individual resonant circuit patterns are as follows: f1=10 MHz, f2=13 MHz, f3=16 MHz, f4=20 MHz, f5=25 MHz, f6=30 MHz, f7=37 MHz, f8=45 MHz, f9=55 MHz, f10=66 MHz, f11=80 MHz, f12=98 MHz, f13=120 MHz, and f14=150 MHz.

The resonant circuit patterns have inherent resonant frequencies which are different from each other. Furthermore, the individual resonant circuits must be designed such that they are completely separated from each other and that they do not affect the adjacent resonant circuits.

The resonant frequency detecting device which is available in the market at present requires a resonant frequency accuracy allowance of ±5%. A desired resonant frequency accuracy is greatly affected by the printing accuracy. A resonant tag which is highly sensitive to detection may be provided by adequately selecting the optimal conductor width, the distance between the conductors and the number of turns of the coil.

FIG. 11 shows an example of the positional arrangement of the resonant circuit patterns which is adopted to design the inductor circuit, and FIG. 12 shows examples of the number of turns of the coil, the width of the conductor, and the distance between the conductors in the inductor circuit.

In a case where a copper or aluminum foil is used as the conductive metal foil, the adjacent resonant circuits may affect mutually. Hence, in this embodiment, the separating portion 8 is provided to separate the individual resonant circuits from each other, as shown in FIG. 1. Printing pattern designing includes provision of such a separating pattern around each resonant circuit which maintains the resonant circuits shielded from adjacent circuits.

Figure 13:
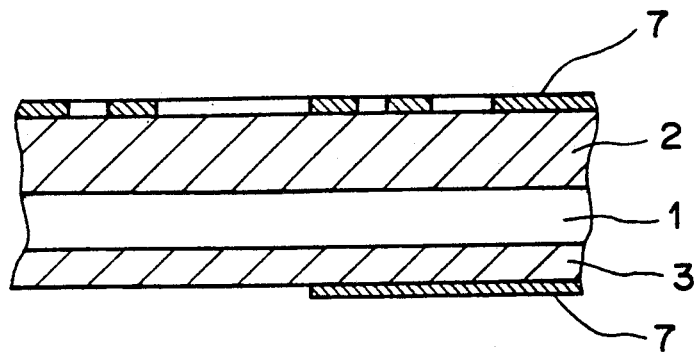
FIG. 13 is a cross-sectional view of a flexible sheet on which patterns are printed.

FIG. 13 is a cross-sectional view of the flexible sheet on which the patterns are printed.

Next, in step S3, etching process is conducted, in which the portion of the metal foils 2 and 3 which does not form the printing patterns is removed using a known acid or alkaline chemical liquid to form the inductor circuit pattern shown in FIG. 8 and the capacitor circuit pattern shown in FIG. 9.

Although the type of chemical liquid used in this etching process depends on the type of conductive metal foil to be removed, in the case of the aluminum foil employed in this embodiment, an aqueous solution of iron 2 chloride($Fe_2O_3$) is used. During the etching, the temperature and the concentration of this etching solution are controlled in accordance with the amount of metal foil to be dissolved, the designed circuit patterns, etching rate and so on. In a case where the spraying method is adopted, the liquid pressure at the distal end of the nozzle is also adequately controlled.

Figure 14:
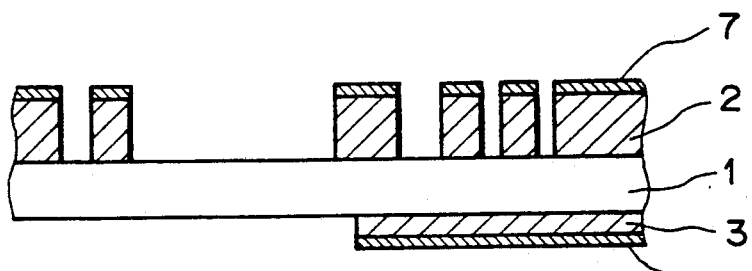
FIG. 14 is a cross-sectional view of the flexible sheet which has been subjected to etching.

Thinning of the conductor in the inductor circuit pattern caused by etching, which is an etching accuracy, is an important factor because it affects the designed resonant frequency. A thinned conductor of 100 microns or less is desirable. FIG. 14 is a cross-sectional view of the flexible sheet which has been subjected to the etching process.

Adhesion of the substrate materials and printing and etching of the circuit patterns may be conducted using rolled wide materials from the viewpoints of reduction in the production cost and capability of mass production. Hence, in this embodiment, the resonant tag patterns are formed in 4 rows, as shown in FIG. 7.

Since the facility which processes a wide material is very expensive, the rolled wide materials, which have been subjected to etching process, are cut into two or three portions in their lateral direction by a cutter, so that the individual portions can be processed by the actually employed facility. In this embodiment, the rolled wide materials are cut into narrow rolled materials having a width ranging from 300 mm to 350 mm.

Subsequently, in step S5, a sheet of good quality paper having a weight of 55g/m² is adhered on an arbitrary surface of each of the flexible sheets, which have been subjected to etching and which have been cut into at least two portions, using an acrylic resin adhesive, and a sheet of parting paper having a weight of 60 g/m² is adhered on the other surface of the flexible sheet using a rubber type adhesive.

Next, in step S6, the multi-layer material with the sheet of paper and the sheet of parting paper adhered thereon is cut into product size of 80 mm × 130 mm with the exception of the parting paper using a platen type die cutter. At that time, an unnecessary portion is removed. Thereafter, the tag sheets are formed into a roll with the remaining parting paper facing outwardly. Usually, the roll has a length of 100 m.

Figure 15:
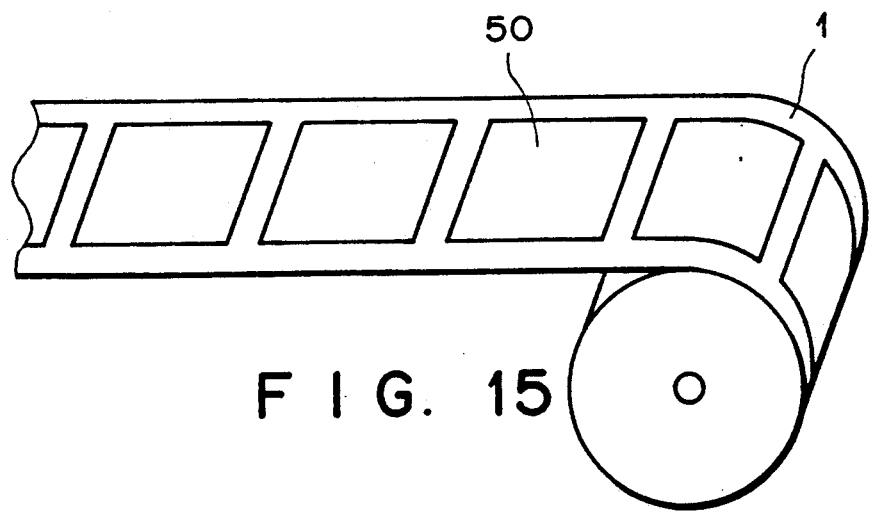
FIG. 15 shows a separated tag sheet roll.

FIG. 15 shows the thus-obtained roll. In FIG. 15, a reference numeral 50 denotes a resonant circuit pattern. Thus, the resonant tags on each of which a plurality of resonant circuit patterns are formed are manufactured in a rolled fashion.

In a case where a plurality of tag sheets are aligned in the direction of the material width, and if a tag sheet roll which carries one row of tag sheets in the direction of material width is required, the roll is further divided into portions in the direction of the material width so that each portion carries only one row of tag sheets.

FIG. 15 shows the thus-obtained roll. In FIG. 15, a reference numeral 50 denotes a resonant circuit pattern.

In this embodiment, the sheet of paper and the sheet of parting paper are adhered on the flexible sheet so as to form a multi-layer material. However, any material may be adhered as long as it is capable of retaining the resonant circuits effectively and it can be parted easily when the tag sheet is used. A plastic sheet may be employed.

When the resonant tag is actually used, desired resonant circuit portions are selected from 14 resonant circuit portions, and the inductor circuits and the capacitor circuits in the selected resonant circuit portions are electrically connected to form resonant circuits.

This electrical connection may be conducted in accordance with the requirements of the customer after the multi-layer material has been cut into production size. Alternatively, it may be conducted by a user at the time the tag sheet is actually used.

Figure 5:
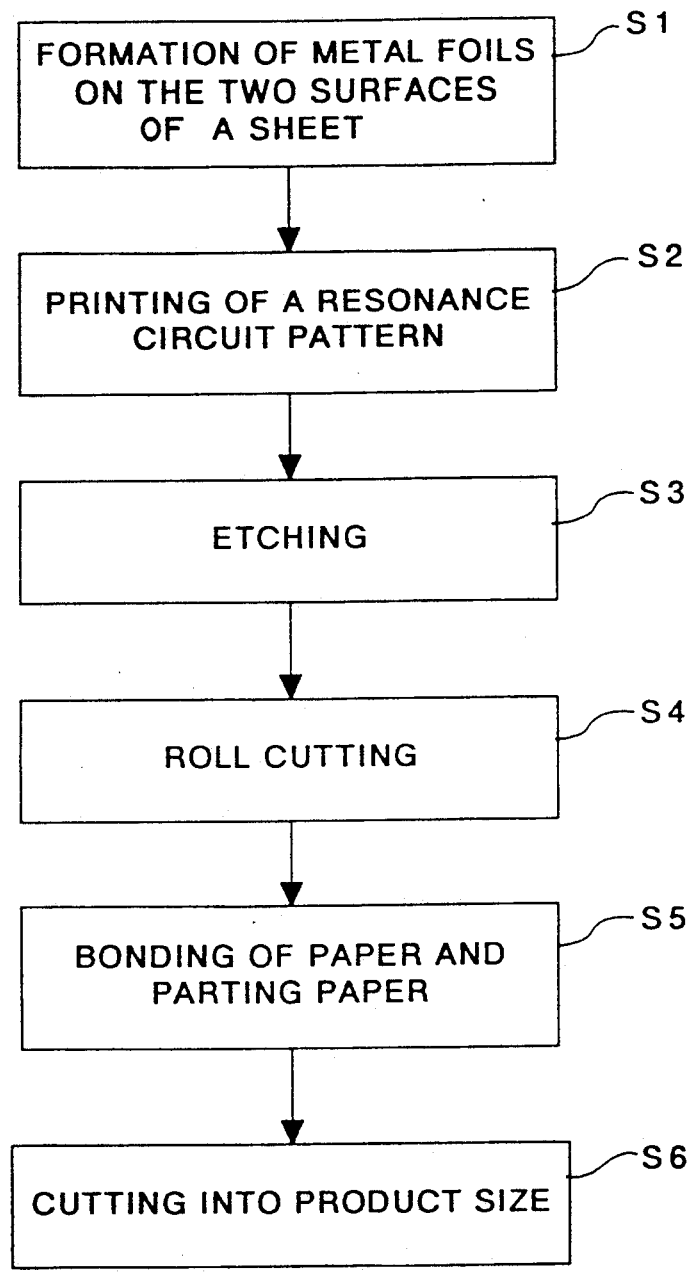
FIG. 5 is a flowchart of the manufacture process of the embodiment of FIG. 1.

In a case where the processing specification for a final product is determined before the multi-layer material is cut into production size or where all or part of the resonant circuits or resonant frequencies to be selected are determined in advance, electrical connection may be conducted subsequent to the process of step S4 shown in FIG. 5, adhesion of paper and parting paper being conducted thereafter. FIG. 16 is a cross-sectional view of a flexible sheet on which the electrical connection has been conducted subsequent to the process of step S4.

The inductor circuit and the capacitor circuit are electrically connected by electrically connecting the metal foils which form the terminals 5 and 11 of each resonant circuit portion. The electrical connection of the terminals 5 and 11 is performed by mechanically pressing them using a cold tool having a file-like chip or by welding them using ultrasonic waves. This electrical connection turns on the resonant circuit. Thereafter, the resonant circuit will become resonant at a predetermined frequency.

Electrical connection provides a complete resonant circuit, and separation into tag sheets provides complete products.

FIG. 17 is a cross-sectional view of a flexible sheet on which electrical connection has been conducted in the manner described above.

In this flexible sheet, the above-described good quality paper or a similar material 14 is adhered on the surface of either the inductor circuit pattern or the capacitor circuit pattern using an adhesive 13, and a sheet of parting paper 16 with a pressure-sensitive adhesive 15 is adhered on the other surface.

n resonant circuits which are present in one sheet tag manufactured in the above-described manner have different frequencies. The individual resonant circuits can be separately resonant at a resonant frequency. When n resonant frequencies are combined with one resonant circuit serving as a reference resonant circuit, the tag can be identified in $2^n - 1$ different ways using the known resonant frequency detection device. For example, in a case where 14 different resonant frequencies are present, as in the case of this embodiment, the sheet tag can be identified in 16,383 different ways. Furthermore, in this embodiment, the identification accuracy is further improved by selecting the orientation and optimal arrangement of the n resonant circuit patterns existing in one sheet tag.

In this embodiment, the optimal results can be obtained when the n resonant circuit patterns are arranged in the manner shown in FIG. 18.

The conductors of the individual resonant circuits may be electrically connected during the manufacture so that all the resonant circuits are on, the resonant circuits which are not used being turned off when the tag information is obtained. In that case, the resonant circuit is turned off by electrically connecting the capacitor portions 6 and 10 or by cutting the patterns.

In the above description, the capacitor circuit pattern 9 contains one capacitor pattern. However, a plurality of capacitor patterns may be formed in the capacitor pattern 9. For example, two or more capacitor patterns may be parallelconnected so that the capacitor value can be changed by the combination of the conductive patterns so as to determine resonant frequency.

In this way, more resonant circuits to be selected can be provided.

In this embodiment, a plurality of resonant circuits having different resonant frequencies can be easily formed in one resonant tag, as stated above. Furthermore, the resonant frequencies of the resonant circuits can be detected anywhere within a range where electric waves can reach, no matter in which way the parcel on which the resonant tag is adhered is oriented or no matter how the parcel is shaped. As a result, if the resonant tag of the present invention is used with the parcels of Takuhaibin, sorting out of the parcels can be facilitated. If the resonant tag is used with the commodities, checkout or sales management can be automated in shops.

The resonant tag can also be applied to commodity management or stealing prevention (prevention of shoplifting).

The resonant tag can also be applied to passengers management for airplanes.

As will be understood from the foregoing description, in the present invention, a plurality of resonant circuits having desired resonant frequencies can be formed on a tag. The tag can be identified by detecting the resonant frequencies of the resonant circuits no matter how the tag is oriented or no matter how the article to which the tag is attached is shaped.

It is to be understood that changes may be made without departing from the spirit and scope of the invention as set forth in the appended claims.

What is claimed is:

1. A resonant tag having an insulating substrate with opposite surfaces and a plurality of resonant circuits, each resonant circuit comprising:

an inductor element pattern formed on one of said opposite surfaces of said substrate, having an inductor terminal portion centrally located on said one surface and said inductor element pattern extending spirally from the inductor terminal portion and ending in a first triangular portion at one corner of the resonant circuit, a capacitor element pattern formed on the other opposite surface of said substrate, having a capacitor terminal portion centrally located and in alignment with the inductor terminal portion on the opposite surface of the substrate, said capacitor element pattern extending from the capacitor terminal portion to a second triangular portion at one corner of the resonant circuit, said first and second triangular portions being in alignment with each other on opposite sides of the substrate, each of said inductor element pattern and said capacitor element pattern being oriented so as to provide the resonant circuit with a central area essentially free of conductive elements, means for selectively electrically connecting the centrally located inductor and capacitor terminal portions of the inductor and capacitor element patterns of each resonant circuit to form an LC resonant circuit having an independent inherent resonant frequency in accordance with said inductor and capacitor element patterns, and an electrically independent conductive pattern forming a separating pattern around each resonant circuit to shield the resonant circuit frequency from the electromagnetic effects of each of the other resonant circuit frequencies.

2. A resonant tag according to claim 1, wherein the plurality of resonant circuits are formed in a plurality of rows, wherein said capacitor element patterns of one of said rows are oriented in a first direction and said capacitor element patterns of at least two other of said rows are oriented in a second direction, said second direction being different from said first direction.

* * * * *